United States Patent [19]

Takemura et al.

[11] 4,443,945
[45] Apr. 24, 1984

[54] ELECTRIC MICROMETER

[75] Inventors: Takehide Takemura; Hiroshi Yamada, both of Hirakata, Japan

[73] Assignee: Matsushita Electric Industrial Co., Ltd., Kadoma, Japan

[21] Appl. No.: 297,500

[22] Filed: Aug. 28, 1981

[30] Foreign Application Priority Data

Sep. 5, 1980 [JP] Japan .......................... 55-126326[U]

[51] Int. Cl.³ .............................................. G01B 3/18
[52] U.S. Cl. ..................................... 33/166; 33/1 PT; 33/172 E; 33/125 C
[58] Field of Search .................. 33/166, 1 PT, 164 R, 33/172 E, 125 C; 340/347 P

[56] References Cited

U.S. PATENT DOCUMENTS

| | | | |
|---|---|---|---|
| 2,873,441 | 2/1959 | Miller | 340/347 P |
| 3,268,885 | 8/1966 | Coyle et al. | 340/347 P |
| 3,286,251 | 11/1966 | Byun et al. | 340/347 P |
| 3,453,752 | 7/1969 | Williams | 33/166 X |
| 3,482,321 | 12/1969 | Inshaw | 33/166 |
| 3,924,336 | 12/1975 | Inoue | 33/164 P |
| 4,255,861 | 3/1981 | Nakata et al. | 33/166 |

FOREIGN PATENT DOCUMENTS 1359029  3/1964  France .................................. 33/166

*Primary Examiner*—William D. Martin, Jr.
*Attorney, Agent, or Firm*—Cushman, Darby & Cushman

[57] ABSTRACT

An electric micrometer with a U-shaped frame has a contact-type rotary encoder comprising a disk which has conductor patterns thereon, and a rotary brush holder which holds rotary brush contacts. The rotary brush holder is rotated by rotation of a spindle. A coupler connects a sleeve journaled to the spindle with the rotary brush holder so that the rotary brush holder rotates together with the sleeve and the spindle but need not have the same rotational axis as the sleeve.

Integral to the frame is a count-and-control circuit which counts the output signal of the rotary encoder and indirectly computes a distance between the frame and an end of the spindle, and a digital indicator which is disposed on a part of the frame and indicates the computed distance.

14 Claims, 12 Drawing Figures

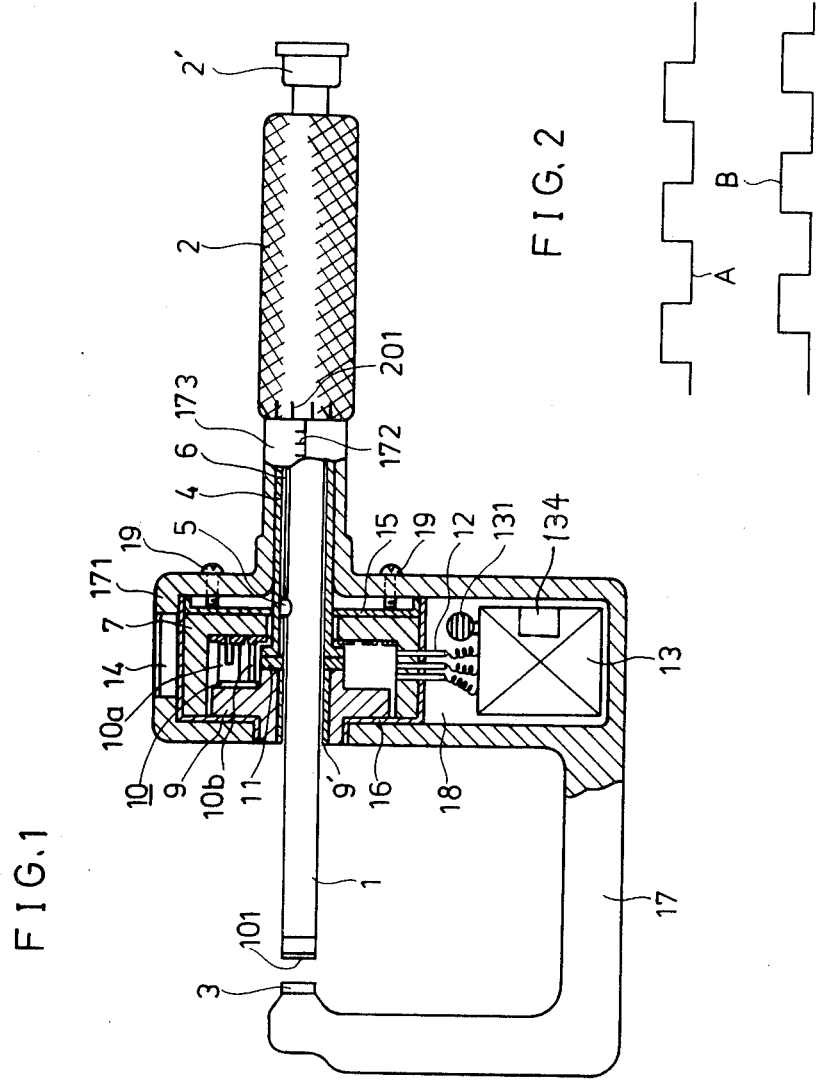

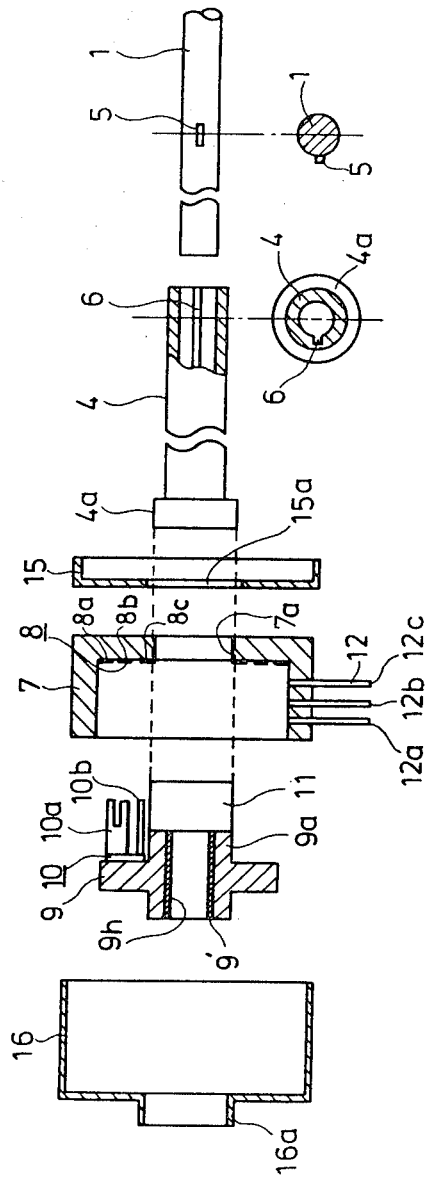
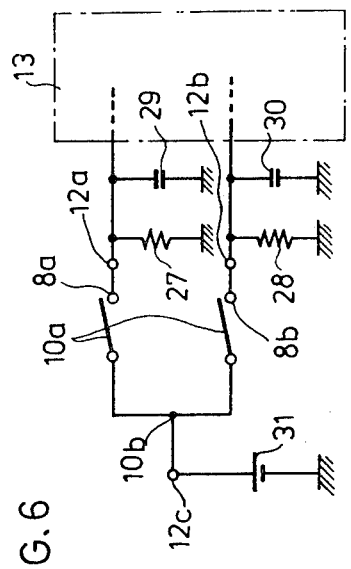
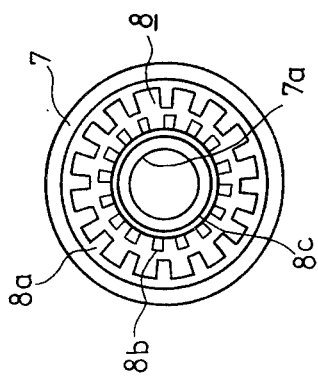
FIG. 3
FIG. 6
FIG. 4

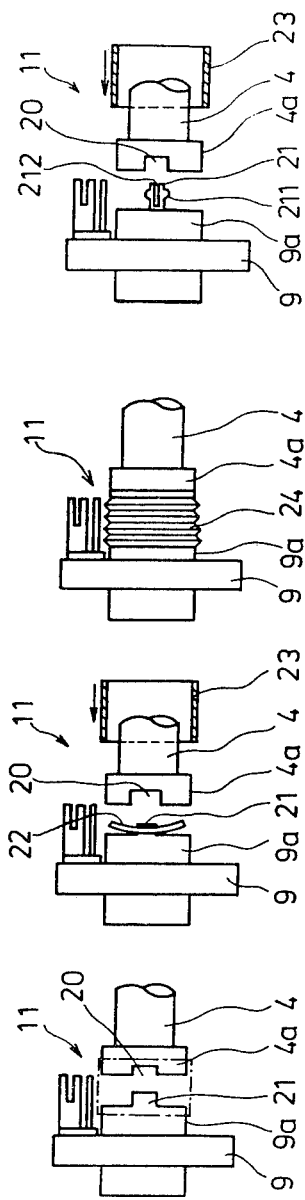

ELECTRIC MICROMETER

BACKGROUND OF THE INVENTION

1. Field of the Invention:

The present invention relates to an improvement in an electrified micrometer where measured size is indicated by a digital numeral display means.

2. Description of Prior Art:

In various kinds of measuring apparatus, digital indication of measured size has been widely adopted, for using digital indication, much of the skill and labor of reading the measured value can be eliminated. However, for such rather inexpensive apparatus as the micrometer, the adoption of the electrified digital indication should be made with rather low cost. Hitherto, several proposals have been made for converting a physical analog signal to motion to a digital signal. For example, a proposed system comprises an optical rotary encoder where rotation of a slit disk is detected by means of an LED and a phototransistor thereby issuing electric pulses corresponding to rotation of the slit disk; another proposed system comprises an electromagnetic encoder including a conversion head which is disposed so as to pick up magnetic flux of a rotary magnetic disk. These proposed systems have drawbacks of large bulk, high cost and high consumption of electric power, and therefore are not appropriate for use in micrometers which should be compact, usually small enough to be carried by hand and operated by a small dry battery stored therein.

SUMMARY OF THE INVENTION

The present invention provides an electric micrometer provided with digital indication means which is free from the above-mentioned drawbacks of conventional apparatuses.

The micrometer of digital indication type in accordance with the present invention can be manufactured cheaply by utilization of a rotary electric encoder of electric contact type.

BRIEF EXPLANATION OF THE DRAWING

FIG. 1 is a partially sectional side view of a micrometer embodying the present invention.

FIG. 2 is a waveform chart showing waveforms of output signal of an encoder of the micrometer of FIG. 1.

FIG. 3 is an enlarged decomposed and partially sectional side view of principal part of the micrometer of FIG. 1.

FIG. 4 is a front view showing a cup-shaped substrate of the encoder.

FIG. 5(A) is an enlarged side view of a coupling means between a brush holder 9 and a sleeve 4.

FIG. 5(B) is an enlarged side view of another coupling means between the brush holder 9 and the sleeve 4.

FIG. 5(C) is an enlarged side view of still another coupling means between the brush holder 9 and the sleeve 4.

FIG. 5(D) is an enlarged side view of still another coupling means between the brush holder 9 and the sleeve 4.

FIG. 6 is a circuit diagram of an input terminal part of a counter circuit to receive the output signal of the encoder.

DESCRIPTION OF THE PREFERRED EMBODIMENT

Figure 7:
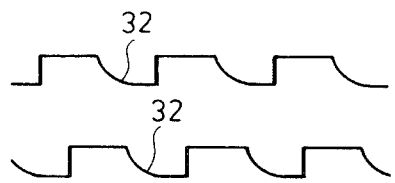
FIG. 7 is a waveform chart showing the waveform of the input terminal part of the counter part of FIG. 6.

The electric micrometer in accordance with the present invention comprises:

an anvil held by a part of a frame, a spindle which is screw-movably held by another part of the frame, a sleeve which is rotatably held by said another part in such a manner to be rotated coaxially with the spindle without an axial advancing, a contacts type rotary encoder comprising a disk substrate, which has a conductor pattern thereon, and a rotary brush holder, which has rotary brush contacts, the disk substrate being fixed to a part of the frame and the rotary brush holder being mounted to link to the sleeve, a count-and-control circuit which is contained in a part of the frame and counts output signal of the rotary encoder and proceed with a predetermined control, and a digital indicator which is disposed on a part of the frame and indicates measured results issued from the count-and-control circuit.

As shown in the attached figures, a known spindle 1 is screw-movably held in a frame 17 in a relation coaxial to a known thimble 2, and hence, the end tip of the spindle 1 travels leftwards and rightwards of FIG. 1 by means of rotation of the thimble 2. By such travelling of the end tip 101 of the spindle 1, a thickness or diameter or other dimension of an object is measured by pinching it between the end tip 101 of the spindle 1 and an anvil 3. The cylindrical part 173 of the frame 17 has a known scale 172, and the thimble 2 also has a minute size scale 201 at the end edge thereof. In the cylindrical part 173 of the frame, a sleeve 4 is provided coaxially covering the spindle 1. The sleeve 4 has a sliding slot 6 which is in a direction parallel to the axis of the sleeve 4, and a pin 5 of the spindle 1 slidably engages with the sliding slot 6, so that the sleeve 4 is driven to rotate by the spindle 1 as the spindle 1 travels in a screw-movement.

The frame 17 contains an encoder casing 16, wherein a disk shaped substrate 7 is fixedly provided. On the disk face of the substrate, three conductors 8a, 8b and 8c are formed coaxially and isolated from each other, by means of known printed circuit art as shown by FIG. 4. The outer conductor 8a has inward protruding comb-shaped electrode, the inner conductor 8b has outward protruding comb-shaped electrode and the innermost or central conductor 8c is a simple conductor ring. The conductors 8a, 8b and 8c are lead out to the lead-out terminals 12a, 12b and 12c respectively, which are connected to the count-and-control circuit 13. The output terminal of the count-and-control circuit 13 is connected to the indication circuit 14. An end part of a brush holder 9 is rotatably held by a receiving part 16a of the cup-shaped casing 16, and the brush holder 9 holds brush 10a to slidingly contact the conductors 8a and 8b and another brush 10b to slidingly contact the conductor 8c. The brush holder 9 has a through-hole 9h for passing the spindle 1 therethrough. The core part 9' of the brush holder 9, through which the through-hole 9h is formed, is preferably made of friction-durable metal. The brush holder 9 has a coupling means 11 which couples the brush holder 9 to the end part flange 4a of the sleeve 4. A DC power source 31 is connected across the terminal 12c and the ground, as shown in FIG. 6; and to the input terminals 12a and 12b, are connected parallel connection of equivalent resistance 27 and equivalent capacitance 29 and parallel connection of equivalent resistance 28 and equivalent capacitance 30 of the input terminals of the count-and-control circuit 13, respectively. The disk shaped substrate 7 has a through hole 7a which rotatably receives the sleeve 4, and is bonded to a fixing disk 15, which is fixed to the frame 17 by screws 19. The cup-shaped casing 16 which fixedly contains the disk-shaped substrate 7 is bonded to the fixing disk 15. The three conductors 8a, 8b and 8c on the substrate 7 and two brushes 10a and 10b on the brush holder 9, both contained in the encoder casing 16, form a contact type encoder. By forming the fixing disk 15 in a very shallow disk and by fixing it to the frame 17 by means of plural screws 19, adjustment of axial alignment of the encoder can be made by adjusting the screws 19, so that a satisfactory operation is obtainable. In FIG. 1 and FIG. 3, the coupling means 11 is generally shown by a simple square component for simplicity, but detailed examples thereof are shown in FIG. 5(A), FIG. 5(B), FIG. 5(C) or FIG. 5(D). The coupling means 11 is employed in order to ensure smooth rotation of the spindle 1 and sleeve 4 even in case of a very small axial difference of the encoder, and to attain easier assembling thereof.

FIG. 5(A) shows a first example of the coupling means 11, which comprises a member 9a having a protrusion 21 in a direction parallel to the axis of the sleeve 4, and another member 4a having a recess 20 to accept the protrusion 21. FIG. 5(B) shows another example of the coupling means 11, which comprises a spring washer 22 between two members 9a and 4a for eliminating undesirable back-lash or shocks in the motions of the two members, and a rubber or the like flexible wrapping sleeve 23 is disposed covering the coupling 11. FIG. 5(C) shows still another example of the coupling means 11, which comprises a bellow 24 of rubber or the like flexible material. FIG. 5(D) shows still another example where the protrusion 21 on a member 9a has a slit 212 and pressing parts 211. The slit 212 gives resilient force to the pressing parts 211, which press the side wall of the recess 20 when inserted therein. The coupler is formed in a unitary body to the brush holder 9 by means of known plastic moulding process. A rubber or the like flexible wrapping sleeve 23 may be provided to cover the coupling 11. This construction has the advantage of reducing the number of components. In order to give durability, the inside of the brush holder 9a may be formed of metal.

As the thimble 2 is rotated, the spindle 1 rotates, and hence through the engagement of the pin 5 and the slot 6, the sleeve 4 and hence the brush holder 9 is rotated. Measured size corresponds to the number of rotations of the brush holder 9, and accordingly, by connecting the terminal 12c to a DC voltage source 31 as shown in FIG. 6, the output terminals 12a and 12b rotatingly touch the conductors 8a and 8b via brushes 10a, 10b respectively, and output pulse trains of different phases are generated, as shown by the waveforms A and B of FIG. 2. Since the pulse phases of the waveforms generated are different from each other, the direction of the rotation of the thimble is detected, and from the number of pulses the angle of rotation, namely, the size of the measured object is detected.

The count-and-control circuit 13 receives pulse trains from the terminals 12a and 12b, counts output pulses, indicates the count result, and when needed issues sound to indicate change of mode (for example, change of units) from a sound alarm device 131.

FIG. 6 shows equivalent circuit of the input end part of the count-and-control circuit 13, where the input terminals have input resistances 27 and 28 and input capacitances 29 and 30, respectively. Since the equivalent circuit has the parallel circuit of the resistance and the capacitance, the voltages at the input terminals of the count-and-control circuit 13 have the waveform including the part 32 of exponential fallings as shown in FIG. 7.

Since the input signals include such exponential fallings (FIG. 7), when the cycles of the pulse trains become high, the exponential falling parts result in inaccurate detection of phase and rotation angle. In order to avoid such shortcoming, it is necessary to make the time constant (which is the product of the resistance and the capacitance) small. This requires use of very small resistors 27 and 28 since the capacitances 29 and 30 can not be reduced extremely. However, such reducing of the resistances 27 and 28 necessarily increases the current therein, and hence the power consumption of the DC voltage source 31 increases. Since a small battery is used for the DC voltage source, the resistance 27 and 28 should be a considerable value. In order to solve this problem, the circuit is constructed such that the input resistors are switched corresponding to the frequency of the pulses. The rotation of the thimble, hence rotation of the spindle, is usually very high only for a very short time, and therefore, by means of suitable pulse-frequency responsive electronic switch or the like means, the input resistance can be switched to a small value only for such short time in order to save power.

Figure 8:
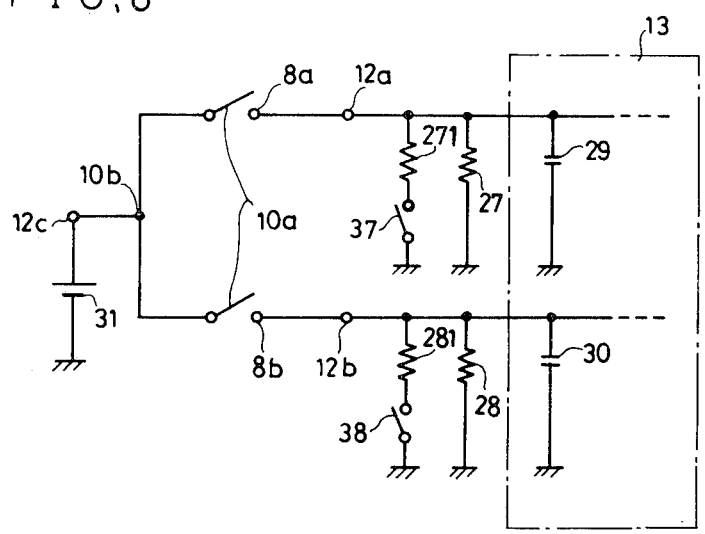
FIG. 8 is an equivalent circuit diagram of a counter control circuit in accordance with the present invention.

FIG. 8 is a circuit diagram of the input terminal part of the count-and-control circuit 13 provided with such improvement capable of such switching for energy saving as well as quick rotational response. The circuit of FIG. 8 comprises, in addition to the circuit of FIG. 6, additional resistors 271 and 281 switchably connected in parallel to the resistors 27 and 28 by means of the pulse frequency responsive switches 37 and 38. Switches 37 and 38 are preferably electronic switches which are switched on when the input pulses have a high frequency, by detecting the input pulses in the circuit 13.

In case further power saving is intended, further multiple stage switchings of a similar manner is preferably used to change the input resistors.

Figure 9:
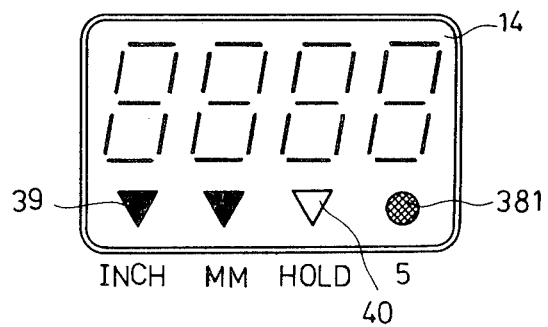
FIG. 9 is a front view of a numeral indication means to be provided in the micrometer of FIG. 1.

The digital indicator 14 is preferably small. However, since 5 digits are required for the indication of the measured results, the indicator 14 may be constructed as shown in FIG. 9, where a dot indicator 381 is provided in such a manner that the black dot appears when the fifth digit, which is next to the lowest digit represented, is 0.5 or larger, and disappears when the fifth digit is smaller than 0.5. Black triangle marks 39 on indications "INCH" and "MM" alternatively indicate mode of units used in the indication. A white triangle mark 40 on indication "HOLD" indicates that the indication is held on the indicator. The selections of the unit mode and holding or releasing are made by known small switches provided on a suitable part on the frame 17. The sound alarm device 131 is provided in the frame and connected to the circuit 13 in a manner to make alarm sound for necessary attention or confirmation of the switching of the unit of mode. It is further preferable for the power saving that the numeral indicator 14 and the count-and-control circuit are switched off by known timer circuit after a lapse of a predetermined time, for example, 5 minutes from the last measurement.

What is claimed is:

1. An electric micrometer comprising:
   a U-shaped frame having first and second arms,
   an anvil held by a first arm of said frame,
   a spindle screw-movably held by said second arm of said frame,
   a sleeve rotatably held by said second arm in such a manner to be rotated coaxially with said spindle without an axial advancing,
   a contact type rotary encoder which comprises a disk substrate provided with conductor patterns thereon fixed to said arm of said frame, and a rotary brush holder provided with rotary brush contacts being mounted to link to said sleeve,
   a count-and-control circuit means contained in said frame for counting output signals of said rotary encoder and proceeding with a predetermined control,
   digital indicator means disposed in said frame for indicating measured results issued from said count-and-control circuit,
   and wherein said brush holder is linked to said sleeve by means of a shaft coupler provided with at least a spring means disposed between said sleeve and said brush holder for preventing back-lash.

2. An electric micrometer in accordance with claim 1 further comprising a flexible sleeve for covering said shaft coupler.

3. A micrometer in accordance with claim 1, wherein said brush holder is linked to said sleeve by means of a bellows.

4. A micrometer in accordance with claim 1, wherein said conductor patterns on said disk substrate comprise
   a first larger ring shaped conductor with inward protrusions at a predetermined pitch,
   a second smaller ring shaped conductor with outward protrusions at another predetermined pitch, and
   a third simple ring shaped conductor, and where:
   one of said rotary brush contacts is commonly in contact with inward protrusions of said first larger ring shaped conductor and outward protrusions of said second smaller ring shaped conductor.

5. An electric micrometer in accordance with claim 1, wherein said brush holder has a through-hole for passing said spindle therethrough and a spring means for preventing shock and back-lash of said coupler in a unitary molded construction.

6. An electric micrometer in accordance with claim 1, wherein
   said rotary brush holder has a metal core part having a through-hole for passing said spindle therethrough.

7. An electric micrometer in accordance with claim 1, wherein said count-and-control circuit comprises:
   electronic switch means for switching input resistors responding to change of frequencies of input signals to said count-and-control circuit,
   timer circuit means for switching a numeral indicator circuit on upon receipt of an input signal and switching said numeral indicator circuit off after lapse of a predetermined time therefrom,
   a sound alarm means for generating a sound alarm at switching of indication mode, and
   a data processing means for counting and processing input signal pulses to produce an indication signal for said digital indicator.

8. An electric micrometer in accordance with claim 1, wherein said digital indicator has, besides a predetermined number of numerals,
   a fraction indication means for indicating a fraction over or under a predetermined value,
   a unit mode indication part, and
   a hold indication part.

9. An electric micrometer comprising:
   a U-shaped frame having first and second arms;
   an anvil fixed to said first arm of said frame;
   a spindle having threads along a portion of its length rotatably journaled to said second arm of said frame, the axial position of an end of said spindle with respect to said anvil being determined by the rotational progression of said spindle along its threads;
   a sleeve rotatably journaled to said spindle to rotate together with said spindle while remaining in a fixed axial position with respect to said frame;
   a first disk, fixedly journaled to said second arm of said frame, having electrical conductor patterns thereon;
   a second disk rotatably journaled to said spindle;
   coupling means for coupling said second disk to rotate together with said sleeve without requiring said second disk and said sleeve to have the same axis of rotation;
   contact means extending from said second disk for making electrical contact with said electrical conductor patterns of said first disk;
   circuit means electrically connected to said contact means for measuring the angle of rotation of said second disk and for indirectly computing the distance between said end of said spindle and said anvil; and
   indicating means connected to said circuit means for indicating said computed distance.

10. An electric micrometer as in claim 9 wherein said sleeve, said first disk, said second disk, said coupling means and said contact means may be separated as a unit from said frame and said spindle.

11. An electric micrometer comprising:
    a U-shaped frame having first and second arms;
    an anvil fixed to said first arm of said frame;
    a spindle having threads along a portion of its length rotatably journaled to said second arm of said frame, the axial position of an end of said spindle with respect to said anvil being determined by the rotational progression of said spindle along its threads;
    a sleeve rotatably journaled to said spindle to rotate together with said spindle while remaining in a fixed axial position with respect to said frame;
    a first disk, fixedly journaled to said second arm of said frame, having electrical conductor patterns thereon comprising:
    a first annular conductor having regular inward radial portions of a first predetermined phase;
    a second annular conductor, concentric with said first annular conductor and having a radius smaller than the radius of said first conductor, having regular outward radial portions of a second predetermined phase different from said first phase; and a third annular conductor concentric with said first conductor;

a second disk rotatably journaled to said spindle;

coupling means for coupling said second disk to rotate together with said sleeve without requiring said second disk and said sleeve to have the same axis of rotation;

contact means extending from said second disk for making electrical contact with said inward radial portions of said first annular conductor, said outward radial portions of said second annular conductor and said third annular conductor and for generating a signal which varies according to the angle and direction of rotation of said second disk with respect to said first disk;

circuit means having said signal as an input for measuring the angle of rotation of said second disk and for indirectly computing the distance between said end of said spindle and said anvil; and indicating means for indicating said computed distance.

12. An electric micrometer as in claim 11 wherein said circuit means comprises:

electronic switching means for changing the input resistance of said circuit means according to the frequency of said signal to reduce power consumption;

timing means for actuating said indicating means when said signal is received and for deactivating said indicating means a predetermined time after said signal is received; and data processing means connected at its input to said signal for indirectly computing the distance between said end of said spindle and said anvil and for outputting said distance to said indicating means.

13. An electric micrometer as in claim 12 wherein said indicating means comprises:

digital numerical display means for displaying said computed distance in one of at least two selectible predetermined units of measurement;

sound alarm means for generating an audible signal when said units of said display means change;

first visual display means for visually indicating which of said predetermined units of measurement is selected; and hold means for retaining a present display of said digital display means and for indicating that said present display is being retained.

14. An electric micrometer of the type comprising a U-shaped frame having first and second arms; and anvil fixed to said first arm of said frame; a spindle having threads along a portion of its length rotatably journaled to said second arm of said frame, the axial position of an end of said spindle with respect to said anvil being determined by the rotational progression of said spindle along its threads; a sleeve rotatably journaled to said second arm of said spindle to rotate together with said spindle while remaining in a fixed axial position with respect to said frame; a first disk fixedly journaled to said second arm of said frame; a second disk rotatably journaled to said spindle; circuit means for measuring the angle of rotation of said second disk to indirectly compute the distance between said end of said spindle and said anvil, and indicating means for indicating said distance, wherein the improvement comprises:

electrical conductor means attached to said first disk for conducting an electrical current;

coupling means for coupling said second disk to rotate together with said sleeve without requiring said second disk and said sleeve to have the same rotational axis; and contact means extending from said second disk for making electrical contact with said electrical conductor means.

* * * * *